United States Patent [19]

Neumann

[11] Patent Number: 4,680,798

[45] Date of Patent: Jul. 14, 1987

[54] AUDIO SIGNAL PROCESSING CIRCUIT FOR USE IN A HEARING AID AND METHOD FOR OPERATING SAME

[75] Inventor: Leopold Neumann, Lexington, Mass.

[73] Assignee: Analogic Corporation, Peabody, Mass.

[21] Appl. No.: 633,446

[22] Filed: Jul. 23, 1984

[51] Int. Cl.[4] ........................ H04R 25/00; H03G 3/20

[52] U.S. Cl. .................................. 381/68.4; 381/68.2; 381/104

[58] Field of Search .................... 179/107 FD, 107 R; 381/68, 69, 104, 68.2, 68.4

[56] References Cited

U.S. PATENT DOCUMENTS

| | | | |
|---|---|---|---|
| 4,187,413 | 2/1980 | Moser | 381/68 |
| 4,222,393 | 9/1980 | Hocks et al. | 128/746 |
| 4,396,806 | 8/1983 | Anderson | 381/103 |
| 4,425,481 | 1/1984 | Mansgold et al. | 381/68.2 |
| 4,471,171 | 9/1984 | Köpke | 381/68 |
| 4,508,940 | 4/1985 | Steeger | 381/68.2 |
| 4,596,902 | 6/1986 | Gilman | 381/68 |

OTHER PUBLICATIONS

*Hearing Instruments,* "Active Filkring-A Step Toward the Programmable Hearing Aid", Rihs et al., vol. 33, No. 1, Oct. 1982, p. 20t.

Wayne J. Stabb, *Hearing Instruments,* "Digital Hearing Aids", vol. 36, No. 11, pp. 14–24.

*Primary Examiner*—Gene Z. Rubinson

*Assistant Examiner*—Danita R. Byrd

*Attorney, Agent, or Firm*—David W. Gomes

[57] ABSTRACT

In a hearing aid of the type having an electrical amplifier, wherein the improvement provides an audio signal processing circuit incorporated into the amplifier and including integral computing circuitry for controlling the operation thereof; the processing circuit providing circuitry for receiving an audio frequency electrical signal, circuitry for separating the audio frequency signal into a plurality of frequency bandwidths, circuitry for separately amplifying any audio frequency signal present in each of the bandwidths, circuitry for summing the amplified audio frequency signals from each of the bandwidths to produce a reconstituted signal, and circuitry for controlling amplification including circuitry for sampling any audio frequency signal present in each of the bandwidths and circuitry for determining, in response to the audio frequency signals sampled from all of the bandwidths the amplification level for each bandwidth for the separate amplification.

14 Claims, 1 Drawing Figure

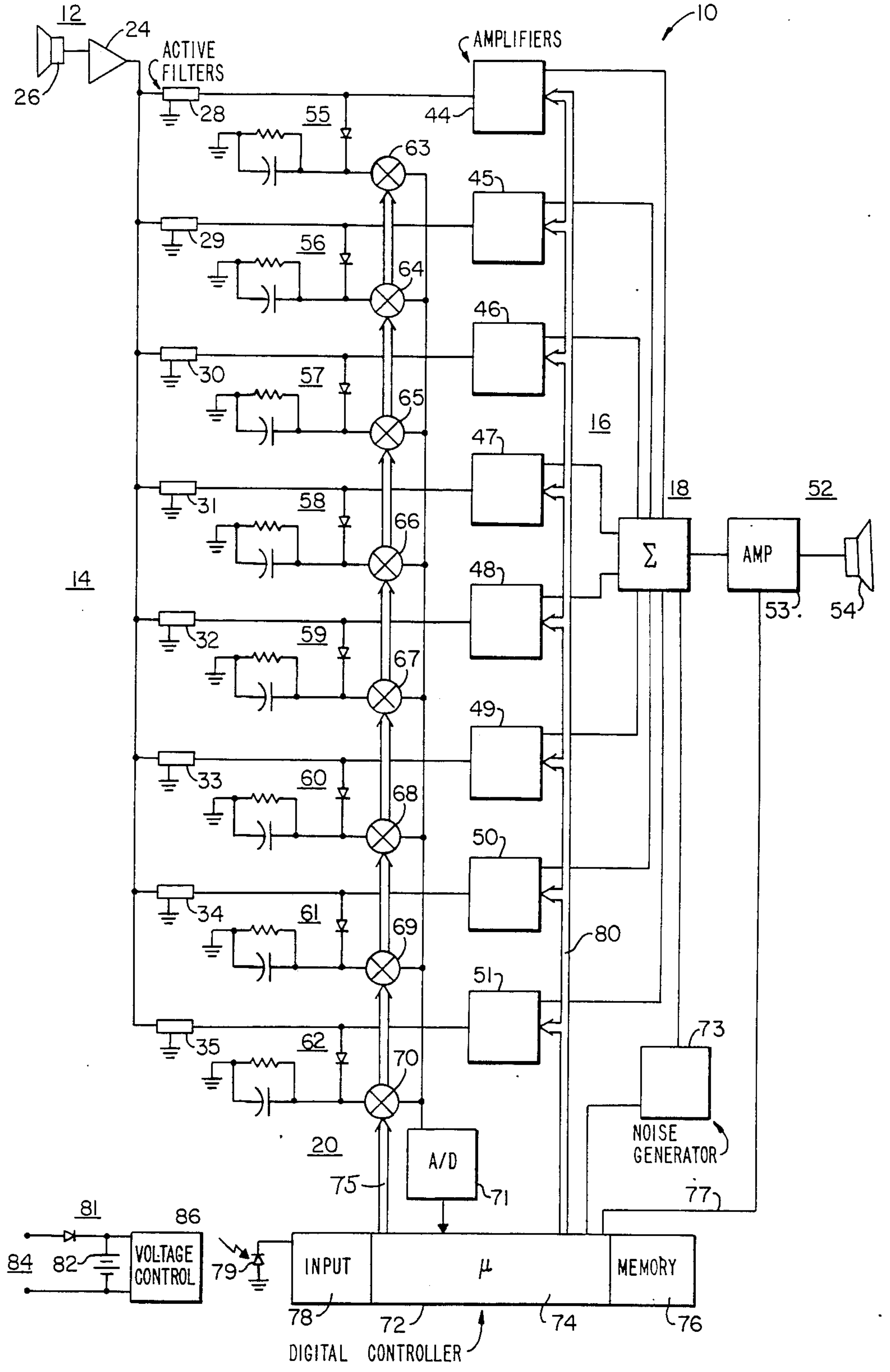
ACTIVE FILTERS
AMPLIFIERS
AMP
NOISE GENERATOR
A/D
VOLTAGE CONTROL
INPUT
μ
MEMORY
DIGITAL CONTROLLER
Σ

AUDIO SIGNAL PROCESSING CIRCUIT FOR USE IN A HEARING AID AND METHOD FOR OPERATING SAME

BACKGROUND OF THE INVENTON

1. Field of the Invention

The present invention generally relates to audio signal processing circuits and, in particular, to their application in hearing aids for the correction of frequency definable hearing loss.

2. Statement of the Prior Art

The respective art areas of hearing aids and audio signal processing circuits are both well known and highly sophistocated. Generally, the trend in hearing aid development has been towards miniaturization for the purpose of providing convenience of use along with aesthetic appearance. Hearing aids incorporating analog circuitry have been constructed having a frequency response which varies over the audio frequency bandwidth. However, such devices have been limited in that the response at any given frequency if fixed and therefore cannot be varied except by an overall volume control or by reconstructing the hearing aid. Thus, these devices cannot easily compensate for variations in background noise and hearing environments, reduction of useable volume range, changes in a user's hearing response, intermittent problems such as tinnitus, or other conditions and situations which would require a variation in the frequency response of the device.

SUMMARY OF THE INVENTION

Accordingly, the present invention provides an audio signal processing circuit for use as an amplifier in a hearing aid and a method for operating the same. The processing circuit allows for both operation at low power levels as required in a small battery operated device and variability in its frequency response to allow specific corrections for varying, frequency definable hearing situations. The audio signal processing circuit incorporated in the amplifier means includes an integral computing means for controlling the operation thereof. A preferred embodiment includes means for receiving an audio frequency electrical signal, means for separating the audio frequency signal into a plurality of frequency bandwidths, means for separately amplifying any audio frequency signal present in each of the bandwidths, means for summing the amplified audio frequency signals from each of the bandwidths to produce an output signal, and means for controlling the means for separately amplifying including means for sampling any audio frequency signal present in each of the bandwidths and means for determining, in response thereto, an amplification level for each bandwidth for the means for separately amplifying.

DESCRIPTION OF THE DRAWING

The present invention is illustratively described below in reference to the accompanying drawings which is a schematic diagram of the general circuit architecture of one embodiment of the present invention.

More specifically, a hearing aid circuit 10 is shown in the drawing having an amplifier which incorporates an audio signal processing circuit including an integral computing means for controlling the operation thereof. The circuit 10 generally includes input means 12 for receiving an audio signal and converting it into an audio frequency electrical signal, separation means 14 for separation the audio frequency electrical signal into a plurality of frequency bandwidths, amplification means 16 for separately amplifying any audio frequency signals present in each of the bandwidths created in separation means 14, summation means 18 for summing the separated audio frequency signals and amplifying the single summed signal for output, and control means 20 for controlling the amplification performed in sections 16 and 18. Control means 20 includes means for sampling any audio frequency signal present in each of the separated bandwidths and determining, in response thereto, amplification levels for each of the separate amplifying means.

Input means 12 commonly include means for receiving an audio frequency electrical signal which, in the present embodiment, is constituted by a preliminary amplifier and buffer 24 coupled for amplifying the output of a microphone 26. The output of amplifier 24 is connected to separation means 14 which provides a network of active filters 28–35 for separating the audio frequency signals into a plurality of bandwidths covering the audio frequency spectrum which is to be controlled by the audio signal processor 10 of the present embodiment. The active filters 28–35 may be embodied by any suitable filters capable of separating the bandwidths desired. The active filters 28–35 should provide a fixed or known gain for any signals separated in each respective bandwidth.

The outputs of filters 28–35 are each connected to a separate amplifier means 44–51 of the amplifier section 16. Amplifiers 44–51 are preferably digitally controllable, variable gain amplifiers. The outputs of amplifiers 44–51 are coupled to summation section 18 where any signals present in the separate bandwidths are reconstructed into a single audio frequency electrical signal. This reconstructed signal is coupled to an output means 52 including a variable gain amplifier 53 and speaker means 54.

As mentioned, the circuit 10 further includes means 20 for controlling the individual amplifiers 44–51 and 53. This control function employs means for sampling any audio frequency signals present in each of the bandwidths and means for determining, in response thereto, an amplification level for each amplifier 44–51 and 53. Generally included are a plurality of detector circuits 55–62, a plurality of switch means 63–70, an analog-to-digital converter 71 and a digital controller 72.

The audio frequency signals present in each of the bandwidths are sensed by a plurality of detector circuits 55–62, each of which is coupled to a separate output of active filters 28–35, respectively. Detector circuits 55–62 commonly include a rectifier diode coupled directly to the respective amplifier output and a parallel resistor-capacitor network coupled between the rectifier diode output and ground. The resistor and capacitor values are chosen to allow the voltage across the capacitor to follow the envelope shape of any audio frequency signals present in the respective bandwidth. The outputs of detector circuits 55–62 are respectively coupled to individual switch means or gates 63–70 for each bandwidth. The outputs of each of the switching gates 63–70 are connected together and to the input of the analog-to-digital converter 71. By controlling signals sent to the switching gates 63–70, via a bus line 75, each of the detector circuits 55–62 may be connected to the analog-to-digital converter 71 thereby affording the capability of coupling each of the separate bandwidths thereto.

Optionally included in the control means 20 is a narrow or limited bandwidth noise generator 73 for providing specialized treatment for tinnitus. Generator 73 is coupled to the controller 72 for control purposes and to summation circuit 18 for introducing its noise signal into the reconstituted audio signal.

The digital controller 72 generally includes a computational section 74, a memory section 76, and an input section 78. The digital controller may be constituted in any suitable form such as a microprocessor or microcomputer. Memory section 76 preferrably includes bandwidth interdependent, frequency response information stored therein for use in controlling the gain levels of amplifiers 44–51 and 53. This information is in the form of one or more algorithms for use in determining the gain levels and a computer program for operating the controller 72 in making use of the algorithms.

The above arrangement of controller 72 allows excellent flexibility in determining the individual gain levels. The known approach of providing a fixed frequency response is improved upon because the gain of any individual channel may be determined in response to the signal levels of one or more of the other channels. For example, if a high level of low frequency noise is present, such as that produced by trains or street traffic, the respective bandwidths could be suppressed or attenuated while higher frequency bandwidths are enhanced. This would improve speech intelligibility in difficult hearing environments. Alternatively, during telephone conversations where only the lower frequency components are present, the frequency response of the circuit 10 could be automatically altered by the algorithm to enhance the lower frequency bands and even to filter spurious high frequency noises. Thus, any definable hearing environment may be compensated for easily and automatically by the audio signal processing circuit 10.

In addition, bandwidth interdependent, frequency response enables more complex dynamic range mapping. Instead of simply compressing the normal hearing range from the threshold of audibility of the threshold of pain into an individual's defective hearing capability, more adaptive and selective bandwidth interdependent mapping algorithms may be employed.

The computer program for operating the controller 72 would typically take tangible form in a non-volatile ROM while, in a preferred embodiment, the bandwidth interdependent, frequency response information would be stored in volatile form so that it may be easily changed. Input section 78 serves the purpose of allowing this information so stored to be changed as desired. Section 78 is shown connected to a photoelectric detector means 79, such as an infrared photodiode, for receiving new information. This flexibility enables the circuit 10 to be easily adapted per individual, per situation or in accordance with changes in an individual's capacity. Thus, a single circuit may be manufactured which could easily be programmed to any one or more of a great variety of specifications. This provides standardization and the reduction of manufacturing costs. The particular choice of algorithms programmed into a circuit or hearing aid would depend upon the needs of each individual user as determined by a professional examination. Thus, compensation for most, if not all, of an individual's needs could easily and inexpensively be incorporated into the algorithms of a hearing aid. Further, these algorithms could be easily changed as an individuals needs changed with the passage of time.

Returning to the controller 72, the control functions performed by the computational section 74 in response to the stored program information are the signalling of switching gates 63–70 via bus line 75 to sequentially connect detectors 55–62 to the converter 71, the generation of control signals for transmission via a bus line 80 to the amplifiers 44–51 for individually controlling their amplification levels, and providing for the updating and changing of the stored frequency response information via input section 78. In the embodiment of circuit 10, computational section 74 additionally controls the gain of amplifier 53 via a control line 77 and the operation of noise generator 73. These functions may be performed by any suitable program selected in accordance with the components used to implement the controller 72.

Lastly, the audio signal processing circuit 10 would commonly include some form of power supply means 81. In the adaptation of the present embodiment as a hearing aid, power supply means 81 might typically include a battery 82, input means 84 for allowing recharging of battery 82 and voltage control section 86 for providing any assorted combination of voltage levels needed for the circuit 10 and any necessary regulation of those voltage levels.

As mentioned, a preferred embodiment of the invention would provide for changing the bandwidth interdependent, frequency response information of the circuit 10, which information is stored in the memory means 76. This may be accomplished by providing software means for the controller 72 which would sense information being received by the photoelectric detector means 79 and cause that information to be stored in place of any previously stored frequency response information. In the hearing aid embodiment of the present invention this information could be quite easily stored in a volatile random access memory and thereafter refreshed at any time desired by the user. Provision could be made in a separate hand held device for programming or even just controlling the hearing aid. Further, provision could be made in a carrying case for the hearing aid for recharging the hearing aid while also restoring the desired frequency response information. The hand held device could easily be used by an individual for such purposes as selecting different algorithms for different hearing environments, triggering tinnitus treatment as needed, just controlling overall volume, or performing any other control function which may become desirable.

The embodiment of circuit 10 would typically function in the following manner. Audio signals picked up by microphone 26 would be amplified by preamplifier 24 and coupled to separation means 14. The audio frequency electrical signals would then be separated into a plurality of bandwidths by separate active filters 28–35. The outputs of filters 28–35 would be detected for their audio frequency signal levels by the detectors 55–62 whose outputs would be sequentially coupled by switching means 63–70 to the input of the analog-to-digital converter 71 under the direction of controller 72. The outputs of filters 28–35 would also be coupled to the inputs of the digitally controllable, variable gain amplifiers 44–51, respectively. The controller 72 would receive the sampling data from the separate bandwidths via converter 71 and determine individual amplification control signals for amplifiers 44–51 and 53 in response to the desired frequency response information and the sampling data. These individual amplification control signals, in digital form, are coupled to their respective amplifiers 44–51 for determining the gain of the respective bandwidth. After individual amplification of each bandwidth, the separated audio frequency signals are coupled to the summation means 18 where the entire audio frequency is reconstituted into a single audio frequency signal and fed through amplifier 53 to an output means 54.

Constructed in accordance with the essential elements of the present invention, a hearing aid or audio signal processing circuit may be provided which exhibits greatly improved performance while remaining small, convenient to use and aesthetically pleasing. Modern hybrid circuit construction techniques allow for the combination of analog and digital circuitry into unobtrusive packages, while the powerful capabilities of digital electronics add magnitudes of performance to the analog amplification function.

Please note that the above description of one embodiment of the present inveniton is intended to be taken in an illustrative and not a limiting sense. Various modifications and changes may be made to this embodiment by persons skilled in the art without departing from the scope of the present invention as defined in the appended claims. For example, sampling of the separate bandwidths may also take place after the variable gain amplification of amplifiers 44–51. Also, different forms of amplifiers may be used such as linear or logarithmic with proper compensation for summing.

What is claimed is:

1. In a hearing aid of the type having an audio signal processing circuit including an integral computing means for controlling the operation thereof, wherein said audio signal processing circuit comprises:

means for receiving an audio frequency electrical signal;

means for separating said audio frequency signal into a plurality of frequency bandwidths;

means for separately amplifying any audio frequency signal present in each of said bandwidths;

means for summing the amplified audio frequency signals from each of said bandwidths to produce a reconstituted signal; and means for controlling said means for separately amplifying including means for sampling any audio frequency signals present in each of said bandwidths and means for determining, in response to the audio frequency signals sampled from all of said bandwidths, an amplification level for each bandwidths for said means for separately amplifying, said means for sampling including an analog-to-digital converter, individual detector means for producing an analog signal representative of the level of audio frequency signal present in each of said bandwidths, and means for sequentially connecting said individual detector means to said analog-to-digital converter.

2. An audio signal processing circuit, comprising:

means for receiving an audio frequency electrical signal;

means for separating said audio frequency signal into a plurality of frequency bandwidths;

means for separately amplifying any audio frequency signal present in each of said bandwidths;

means for summing the amplified audio frequency signals from each of said bandwidths to produce a reconstituted signal; and means for controlling said means for separately amplifying including means for sampling any audio frequency signals present in each of said bandwidths and means for determining, in response to the audio frequency signals sampled from all of said bandwidths, an amplification level for each bandwidth for said means for separately amplifying, said means for sampling including an analog-to-digital converter, individual detector means for producing an analog signal representative of the level of audio frequency signal present in each of said bandwidths, and means for sequentially connecting said individual detector means to said analog-to-digital converter.

3. The circuit of claim 2, wherein said means for determining an amplification level include digital computational means for producing an amplification control signal for each of said means for separately amplifying.

4. The circuit of claim 3, further comprising a variable gain amplifier means coupled to receive said reconstituted signal for output amplification and having control means coupled to said computational means for allowing determination of the gain of said variable gain amplifier means thereby.

5. The circuit of claim 4, wherein each said means for separately amplifying includes a variable gain amplifier means for receiving any audio frequency signal present and said amplification control signal.

6. The circuit of claim 5, wherein said variable gain amplifier means are digitally controllable.

7. The circuit of claim 3, wherein said computational means include means for storing bandwidth interdependent, frequency response information for use in producing said amplification control signals.

8. The circuit of claim 7, wherein said means for controlling include means for changing said bandwidth interdependent, frequency response information stored in said computational means.

9. A method of operating an audio signal processing circuit for a hearing aid comprising the steps of:

receiving an audio frequency electrical signal;

separating said audio frequency signal into a plurality of frequency bandwidths;

separately amplifying any audio frequency signal present in each of said bandwidths;

summing the amplified audio frequency signals from each of said bandwidths to produce a reconstituted signal; and controlling said means for separately amplifying including sampling any audio frequency signals present in each of said bandwidths and determining, in response to the audio frequency signals sampled from all of said bandwidths, an amplification level for each bandwidth for said separately amplifying, said sampling including individually detecting any audio frequency signal present in each of said bandwidths, producing an analog signal representative of the level of audio frequency signal present in each of said bandwidths, and sequentially connecting the respective said representative analog signal from each of said bandwidths to an analog-to-digital converter.

10. The method of claim 9, wherein said determining an amplification level includes digitally computing an amplification control signal for each said bandwidth for said separately amplifying.

11. The method of claim 10, wherein said controlling said separately amplifying includes digitally controlling said separately amplifying.

12. The method of claim 10, wherein said digitally computing includes using bandwidth interdependent, frequency response information.

13. The method of claim 12, further comprising the step of changing said bandwidth interdependent, frequency response information as needed.

14. The method of claim 13, further comprising the step of selectively adding a limited bandwidth noise signal to said reconstituted audio frequency signal for the purpose of treating tinnitus.

* * * * *